(12) United States Patent
Chen et al.

(10) Patent No.: US 11,581,289 B2
(45) Date of Patent: Feb. 14, 2023

(54) MULTI-CHIP PACKAGE

(71) Applicant: STMICROELECTRONICS PTE LTD, Singapore (SG)

(72) Inventors: Yong Chen, Singapore (SG); David Gani, Choa Chu kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 9 days.

(21) Appl. No.: 16/935,081

(22) Filed: Jul. 21, 2020

(65) Prior Publication Data

US 2021/0035952 A1    Feb. 4, 2021

Related U.S. Application Data

(60) Provisional application No. 62/880,581, filed on Jul. 30, 2019.

(51) Int. Cl.

| H01L 25/065 | (2006.01) |
|---|---|
| H01L 21/56 | (2006.01) |
| H01L 25/16 | (2006.01) |
| H01L 23/13 | (2006.01) |
| H01L 23/498 | (2006.01) |
| H01L 23/00 | (2006.01) |

(52) U.S. Cl.
CPC ........ H01L 25/0657 (2013.01); H01L 21/563 (2013.01); H01L 21/565 (2013.01); H01L 23/13 (2013.01); H01L 23/49816 (2013.01); H01L 23/49866 (2013.01); H01L 24/05 (2013.01); H01L 24/32 (2013.01); H01L 25/16 (2013.01); H01L 2224/05009 (2013.01); H01L 2224/32225 (2013.01); H01L 2225/06503 (2013.01)

(58) Field of Classification Search
CPC .......... H01L 2224/32225; H01L 23/13; H01L 25/0657; H01L 24/05; H01L 25/50; H01L 23/481; H01L 23/49816; H01L 21/76898; H01L 21/563; H01L 25/16; H01L 21/565; H01L 23/49866; H01L 24/32
See application file for complete search history.

(56) References Cited

U.S. PATENT DOCUMENTS

| 7,098,070 | B2 | 8/2006 | Chen et al. | |
|---|---|---|---|---|
| 9,929,130 | B2 | 3/2018 | Kent | |
| 2010/0032811 | A1* | 2/2010 | Ding | H01L 21/76898 257/621 |
| 2013/0207260 | A1* | 8/2013 | Hsu | H01L 24/05 257/738 |
| 2017/0236809 | A1 | 8/2017 | Trimberger et al. | |
| 2020/0091126 | A1* | 3/2020 | Lin | H01L 24/20 |

OTHER PUBLICATIONS

Lau, "3D IC Packaging 3D IC Integration," CPMT Distinguish Lecture, San Diego Chapter, Feb. 23, 2015, 111 pages.

* cited by examiner

*Primary Examiner* — Jasmine J Clark
(74) *Attorney, Agent, or Firm* — Seed IP Law Group LLP

(57) ABSTRACT

A multi-chip package including a first integrated circuit and a second integrated circuit. The first integrated circuit includes a first side having a first conductive layer, a second side having a second conductive layer, and an edge, the first conductive layer coupled to the second conductive layer at a location adjacent to the edge. The second integrated circuit is coupled to the second conductive layer of the first integrated circuit.

19 Claims, 9 Drawing Sheets

MULTI-CHIP PACKAGE

BACKGROUND

Technical Field

The present disclosure relates to a primary integrated circuit coupled to one or more secondary integrated circuits, in particular using a backside of the primary integrated circuit.

Description of the Related Art

Coupling a primary integrated circuit to one or more smaller secondary integrated circuits (IC) is usually performed on a surface of the primary IC where active devices are located, sometimes referred to as the "active surface" or "top surface". An opposite surface of the primary IC being a "passive surface" or "bottom surface." This active surface of the IC or die is often expanded so that the total area accommodates bond pads for the primary IC and bond pads for the secondary IC. This total area includes any guard or die perimeter as dictated by the design of the IC.

Providing more than one die in a package provides varied functionality as is beneficial for different applications. As different die and ICs have different technical capabilities and are optimized by selecting particular materials and processes to form the IC or die, not all ICs can be easily manufactured in a same die and instead are coupled together post manufacturing.

Examples of multi-chip packages include a complementary metal oxide semiconductor (CMOS) digital processor (primary IC) coupled to a gallium arsenide (GaAs) transceiver (secondary IC), a low-frequency synthesizer (primary IC) coupled to a high-frequency voltage controlled oscillator (VCO) and a pre-scaler (secondary IC), and a low voltage CMOS memory (primary IC) coupled to a high voltage power regulator (secondary IC). The primary IC is sometimes termed the "parent" or "host" and the secondary IC the "child."

BRIEF SUMMARY

The present disclosure is directed to coupling one or more secondary integrated circuits or die onto a larger, primary IC or die with minimal increases in an overall die area of the primary IC, while maintaining compatibility with current front end semiconductor processes.

In one embodiment, a first die includes a recess or trench in a passive surface of the first die with a second die positioned in the recess. The first die includes contact pads that are exposed from the passive surface and are coupled to the second die through traces or electrical connections that extend from the recess to the contact pads.

The present disclosure describes multi-chip packages that include a first integrated circuit that includes a plurality of solder balls and a shaped passive surface. At an edge of the first integrated circuit, a first conductive layer that is intermediately positioned within the first integrated circuit is coupled to a second conductive layer that is formed on the shaped passive surface. A second integrated circuit is coupled to the second conductive layer of the first integrated circuit. The second integrated circuit is positioned in a first thinned area on the second side of the first integrated circuit. A second thinned area is adjacent to the edge of the first integrated circuit. At this second thinned area, a portion of the second conductive layer is exposed and coupled to the first integrated circuit. The first thinned area may be a recess on the second side, such that the second integrated circuit is coupled to the conductive trace inside the recess.

In another embodiment of the present disclosure, a package includes a first die and a second die. The first die is bigger than the second die. The first die includes a semiconductor substrate having an active surface and a passive surface. The second die includes a semiconductor substrate having an active surface and a passive surface.

A redistribution layer is on the active surface of the substrate of the first die, including solder balls or external contacts on a first surface of the package. A plurality of contact pads are coplanar with the active surface of the substrate of the first die. These plurality of contact pads are exposed by removing portions of the substrate from the passive surface of the first die, which form a first thinned area at an edge of the first die and a second thinned area at a central region of the first die.

The second die is positioned in the second thinned area. Solder balls or electrical contacts of the second die are coupled to electrical traces that extend from the second thinned area across the thinned passive surface of the first die and are coupled to the plurality of contact pads. The package may include a molding compound that surrounds the first and second die.

BRIEF DESCRIPTION OF THE SEVERAL VIEWS OF THE DRAWINGS

Reference will now be made, by way of example to the accompanying drawings. In the drawings, identical reference numbers identify similar elements or acts.

In some drawings, however, different reference numbers may be used to indicate the same or similar elements. The sizes and relative positions of elements in the drawings are not necessarily drawn to scale. Some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures or methods associated with chip processing have not been shown or described in detail to avoid unnecessarily obscuring descriptions of the embodiments.

Unless the context indicates otherwise, throughout the specification and claims which follow, the word "comprise" and variations thereof, such as, "comprises" and "comprising" are to be construed in an open, inclusive sense that is as "including, but not limited to." Further, the terms "first," "second," and similar indicators of the sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

Figure 1:
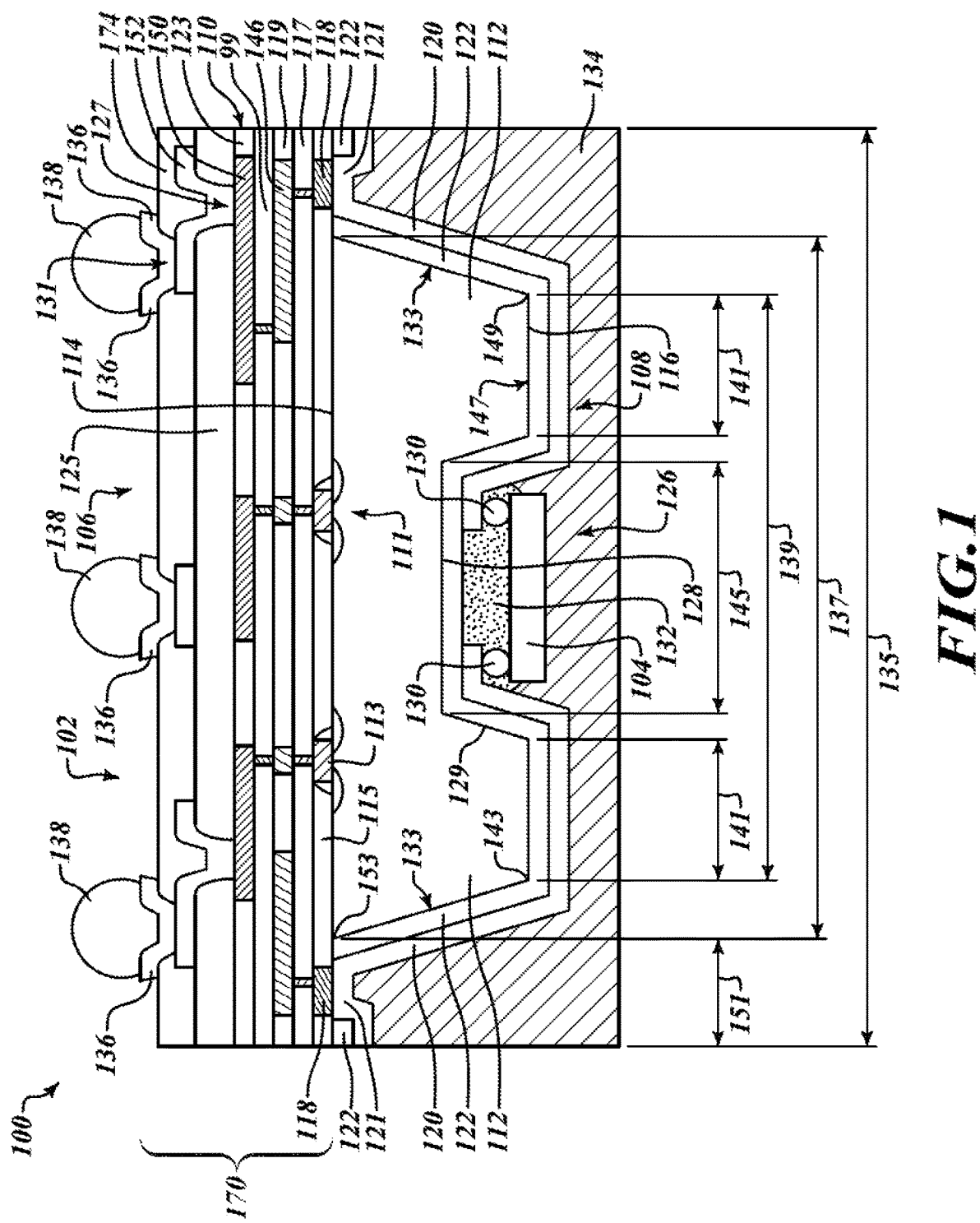
FIG. 1 is a cross-sectional view of a multi-chip package, in accordance with a preferred embodiment.

Referring to FIG. 1, in one preferred embodiment, a multi-chip device or package 100 includes a "parent" or first integrated circuit 102 coupled to a "child" or second integrated circuit 104. The first integrated circuit 102 may be referred to as a first die and the second integrated circuit 104 may be referred to as a second die. The first integrated circuit includes a first side 106, a second side 108 and an edge or sidewall 110. The first integrated circuit 102 also includes a semiconductor substrate 112 having an active first side 114, or first surface, and an inactive second side 116, or second surface. The semiconductor substrate may be silicon or any other suitable semiconductive material. The multi-chip device or package 100 includes a plurality of stacked layers 170.

The active first side 114 of the substrate 112 includes active and passive components 111 formed in and on the substrate. The active and passive components may include transistors, resistors, capacitors, and other circuitry useful in integrated circuits. Aspects of the active and passive components, including electrical connections are formed in a plurality of dielectric and metal layers formed on the active first side 114 of the substrate 112. For example, gate 113 is part of an exemplary transistor that includes dielectric sidewalls and source/drain regions in the substrate. The gate 113 and the source/drain regions are coupled to a plurality of interconnection layers or conductive layers 149 that provide power and signals through the integrated circuit. Not all connections are shown, for simplicity. The illustrated connections are described below.

A first dielectric layer 115 is formed on the active first side 114 of the substrate and surrounds the gate 113. The plurality of conductive layers 149 include a first plurality of vias 144 that couple the devices formed on and in the substrate through various layers to a plurality of contact pads, such as pad array 136. The vias 144 are formed in a second dielectric layer 117. A first interconnect layer 146, which may be metal one, is formed in a third dielectric layer 119. A second plurality of vias 148 couple the first interconnect layer to a second interconnect layer 150, which may be metal two. The second plurality of vias 148 are formed in a fourth dielectric layer 99 and the second interconnect layer 150 is formed in a fifth dielectric layer 123.

The second interconnect layer 150 provides contact pads for coupling to a redistribution layer or other suitable chip processing techniques to form the connections to other devices or printed circuit boards. There may be more dielectric layers and interconnect layers as the end use of the chip may dictate. The first and second interconnect layers are shown for illustrative purposes.

A sixth dielectric layer 125 is formed on the second interconnect layer 150 and includes openings 127 to expose a conductive surface. A first redistribution layer 152, which is conductive, is formed in the opening 127 and extends onto a portion of the sixth dielectric layer. A seventh dielectric layer 174 is formed on the first redistribution layer 152 and includes openings 131 that expose conductive surfaces of the first redistribution layer in a pattern that matches the pad array 136. Solder balls 138 are coupled to the pad array 136.

A first plurality of first contact pads 118 is formed early in the process of building the active and passive components 111 of the first integrated circuit. In particular, the first contact pad 118 is formed in the first dielectric layer 115. The plurality of first contact pads 118 may be formed at the same time as the gates 113 if the materials are suitable. Alternatively, the gate and first contact pad may be formed at different times. In another alternative, the plurality of first contact pads 118 may be in the second dielectric layer. The plurality of first contact pads 118 is closer to the active first side 114, the active surface of the substrate, than the pad array 136. The plurality of first contact pads 118 is closer to the active first side 114, the active surface of the substrate, than the first redistribution layer 152.

Examples of a material for the plurality of first contact pads 118 include conductive materials such as doped polysilicon, and metals such as aluminum (Al) with a titanium tungsten (TiW) contact enhancement layer, and copper (Cu) with a titanium nitride (TiN) barrier layer. The first plurality of first contact pads 118 may be electrically coupled with a plurality of conductive layers 149 on the first side 106 of the first integrated circuit 102. Examples of electrical coupling include galvanic and capacitive coupling.

The inactive second side 116 of the first integrated circuit has a unique surface in that the surface has been contoured or otherwise shaped to accommodate the second integrated circuit. The substrate 112 includes angled sidewalls 133 that extend from the active first side 114 of the substrate to the inactive second side 116 of the substrate, angling inward towards a recess 126.

A widest dimension, a first dimension 135 of the first integrated circuit 102 extends from sidewalls 110 to the opposite sidewalls 110. The substrate 112 has a widest dimension, a second dimension 137 that is less than the first dimension 135. The recess 126 has a third dimension 145 at a recess surface 128. The third dimension is less than the first dimension and less than the second dimension. An outermost surface 147 of the substrate 112 has a fourth dimension 141 that is less than the first dimension and less than the second dimension. A fifth dimension 139 extends between a first corner 143 and a second corner 149 of the second side 108 of the substrate. This fifth dimension 139 is less than the first dimension and less than the second dimension The contact pads 118 are in a region 151 that is between the sidewall 110 and a widest edge 153 of the substrate 112. At least a portion of the contact pads 118 are not covered by the substrate 112. At least the portion of the contact pads 118 are exposed when the substrate 112 is etched and shaped to form the recess 126 and other surfaces of the second side of the first integrated circuit 102.

A conductive trace or redistribution layer 120 is included on the second side 108 that extends from the recess 126 to the contact pads 118. A dielectric layer 122, which may be a polyimide layer or any other suitable dielectric is formed on the substrate. The dielectric layer 122 is between the redistribution layer 120 and substrate 112. Examples of materials that may be used for the redistribution layer 120 include conductive metal such as copper (Cu) with a TiN barrier layer and aluminum (Al). Near the sidewall 110 of the first integrated circuit 102, the first plurality of first contact pads 118 are exposed from the substrate 112. The redistribution layer 120 forms a plurality of second contact pads 121 on the second side 108 of integrated circuit 102 where redistribution layer 120 couples to the first contact pad. The dielectric layer 122 includes an opening where the conductive trace 120 couples to the contact pad 118.

The recess 126, in the second side 108 of the first integrated circuit 102, includes the recess surface 128 and the adjoining recess wall 129. The recess is centrally located in this embodiment. The recess 126 at least partially encloses the second integrated circuit 104. The redistribution layer 120 runs from second contact pad 121 to the recess surface 128 inside the recess 126. The second integrated circuit 104 includes a ball grid array 130, which is coupled to the redistribution layer 120. Underfill or a dielectric material 132, between the first integrated circuit 102 and the second integrated circuit 104, adds mechanical strength and protects the coupling between the second conductive layer 120 and the second integrated circuit 104.

A molding compound 134 encases the inactive second side 116 of the first integrated circuit 102 and the second integrated circuit 104, in a resin. The pad array 136 of the first integrated circuit 102 exposed and solder balls 138 are coupled to the pad array 136.

Figure 2:
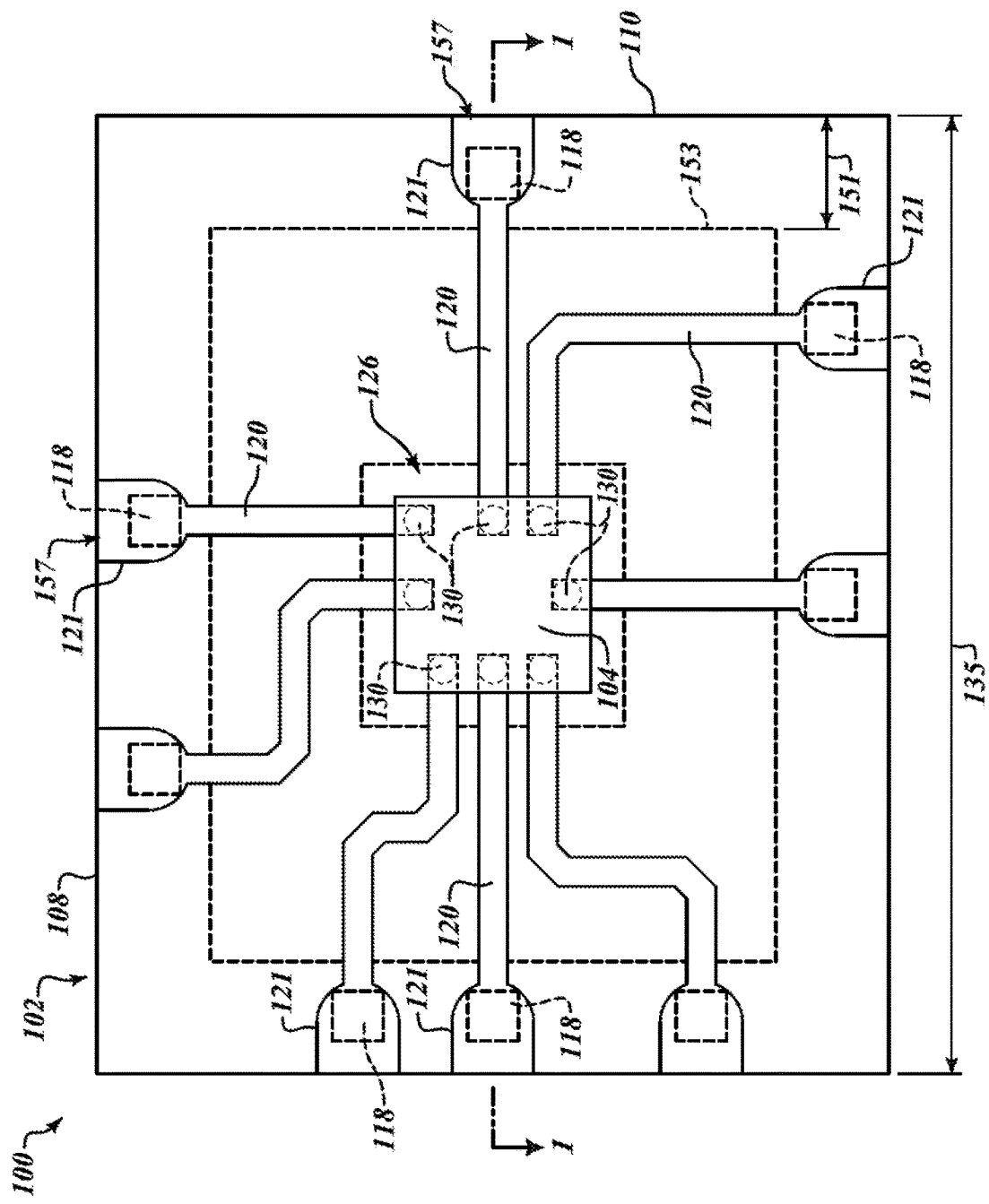
FIG. 2 is a plan view of the multi-chip package with the molding compound omitted for clarity, in accordance with the embodiment of FIG. 1.

FIG. 2 is a top plan view of the multi-chip package 100 without molding compound 134, revealing the second side 108 of the first integrated circuit 102 and the second integrated circuit 104. The second integrated circuit 104 is centrally positioned within the recess 126 of the first integrated circuit. Solder balls of the ball grid array 130 are formed in the recess and coupled to respective ones of the redistribution layers 120. Each redistribution layer 120 has been patterned to couple the first plurality of first contact pads 118, through the second contact pad 121, to the respective terminal of ball grid array 130.

The first contact pads 118 are formed in the region 151 between the widest edge 153 of the substrate 112 and the sidewalls 110. As the substrate 112 is etched to form the recess 126 openings 157 are etched through the substrate to expose each first contact pad 118. The surrounding areas around the first contact pads 118 may contain semiconductor substrate to provide support and protection for those parts of the integrated circuit. The openings 157 are illustrated as U-shaped that extend all of the way to the sidewall 110, however other shapes are envisioned. For example, the openings 157 may not extend all of the way to the sidewall 110.

Processing and assembly of the multi-chip package 100 of FIG. 1 is described below in FIGS. 3-8. FIGS. 3-8 are cross-sectional views through cut line 1-1 of FIG. 2. Processing of the multi-chip package 100 is performed at a wafer scale. Dicing of a wafer of a plurality of first integrated circuits 102 (individual die) with the second integrated circuit 104 attached occurs after the molding is applied in FIG. 8. FIGS. 3-8 illustrate processing with one first integrated circuit 102 and one second integrated circuit 104.

Figure 3:
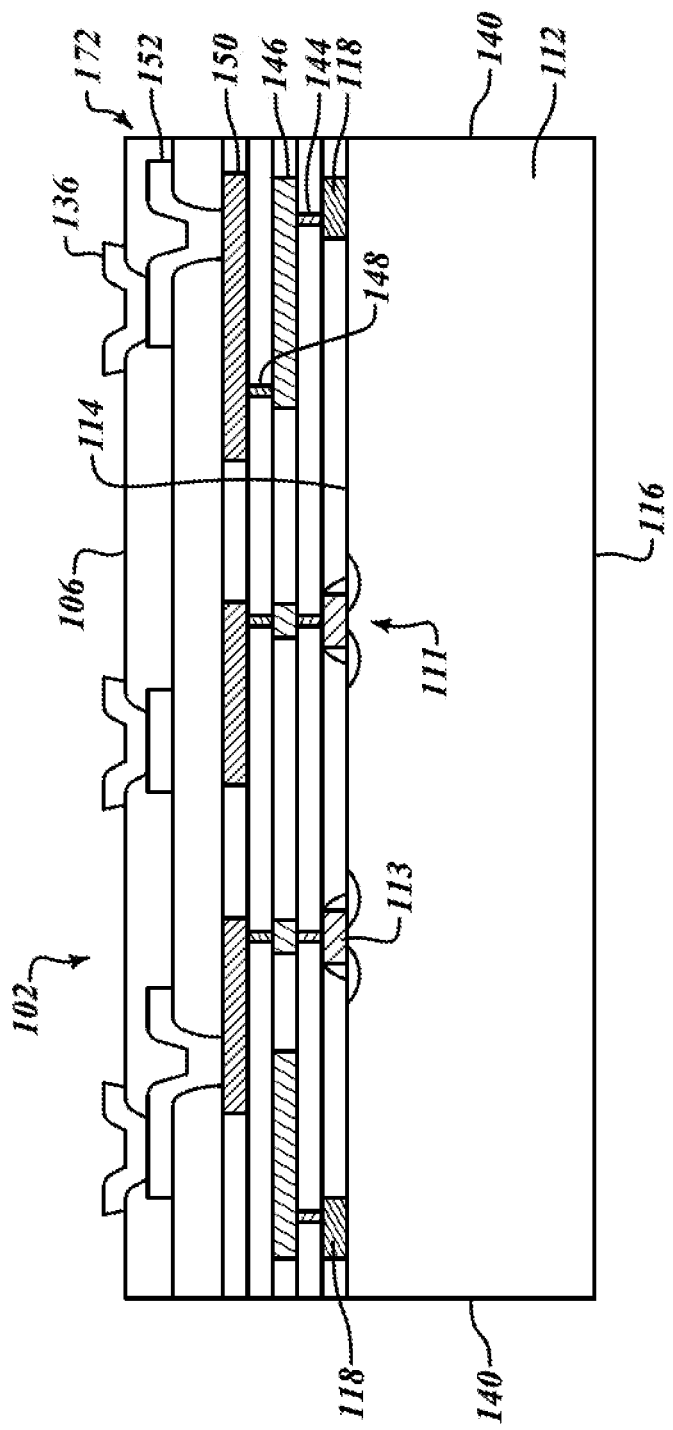
FIG. 3 is a cross-sectional view of a first integrated circuit, before beginning a process to couple a second integrated circuit, in accordance with the embodiment of FIG. 1.

Referring now to FIG. 3, the first integrated circuit 102 after the active and passive components 111, the dielectric layers 172, and the interconnect layers have been formed, but prior to processing of the second side 108 of the substrate 112 and assembly of the complete package. The substrate 112 includes a die perimeter 140, a line that represents the perimeter that formed once the individual die are separated from the wafer (diced). The first plurality of first contact pads 118 is in contact with substrate 112 near the sidewall 110, which is coplanar with the die perimeter 140.

Figure 4:
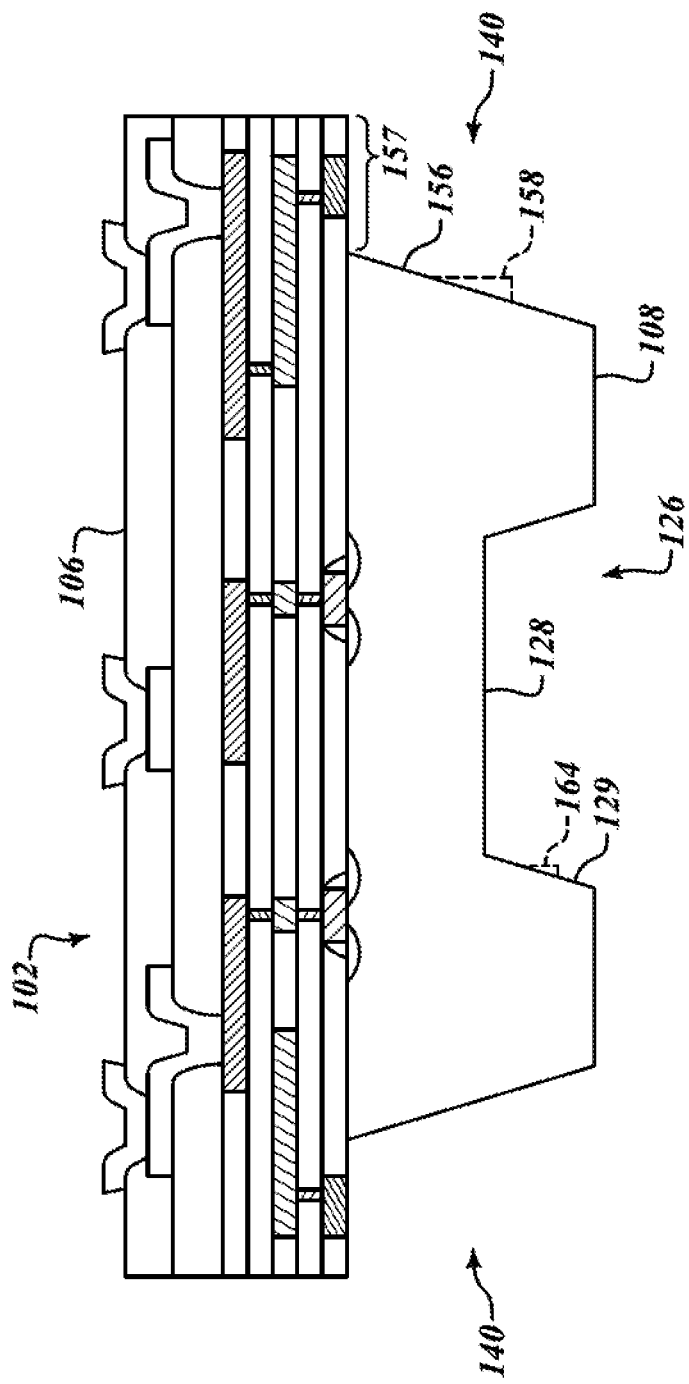
FIG. 4 is a cross-sectional view of the first integrated circuit, after etching a recess into and thinning an area near an edge of the first integrated circuit, in accordance with the embodiment of FIG. 1.

Referring now to FIG. 4, the second substrate side or inactive second side 116 of the substrate 112 is shaped to form the recess and expose the first contact pads 118. Portions of the substrate are removed in one or more steps to create the different surfaces of the substrate. For example, the substrate may be patterned with an etch mask followed by etching of die perimeter 140 and the recess 126. One or more of the many silicon etch methods known to those skilled in the art may be used, examples of which include wet etching, dry etching, and chemical mechanical removal. Etching of die perimeter 140 may be done concurrent with etching recess 126, may be done separately or may be done partially concurrent in a series of etch process steps.

Etching the die perimeter 140 creates the openings 157 adjacent to the sidewall 110, which expose the first contact pads 118. Portions of the substrate may remain in other areas not illustrated in this cross section. The etching process forms an etched substrate perimeter 156 having a slope 158. Etching the die perimeter 140 continues at least until the first plurality of first contact pads 118 is exposed to the second side 108 and the slope 158 allows a patterning and deposition of the subsequent dielectric layer 122 and redistribution layer 120.

It is preferable that the recess surface 128 be flat, substantially planar, to allow coupling of the first integrated circuit 102 to the second integrated circuit 104. The recess side wall 129 has a slope 164 which is low enough to allow patterning and deposition of the subsequent dielectric layer 122 and redistribution layer 120.

Figure 5:
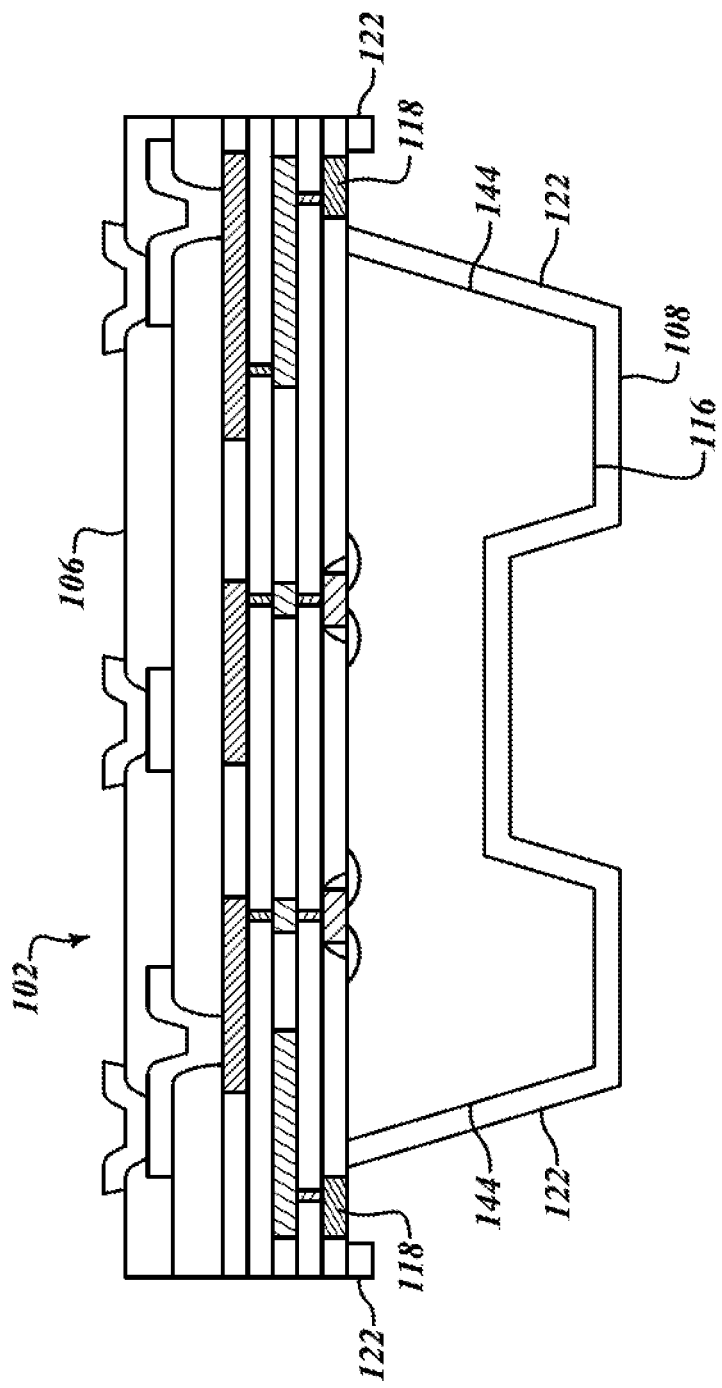
FIG. 5 is a cross-sectional view of the first integrated circuit, after a dielectric is deposited and patterned, in accordance with the embodiment of FIG. 1.

Referring now to FIG. 5, the dielectric layer 122 is deposited on the perimeter 156, on the outermost surface or inactive second side 116 and in the recess 126. The openings 157 are then formed through the dielectric layer 122. This can be achieved by patterning and etching or through other suitable techniques. The openings expose the plurality of first contact pads 118 to the second side 108. Small portions of the dielectric layer 122 remain along the sidewall 110 in some embodiments.

Figure 6:
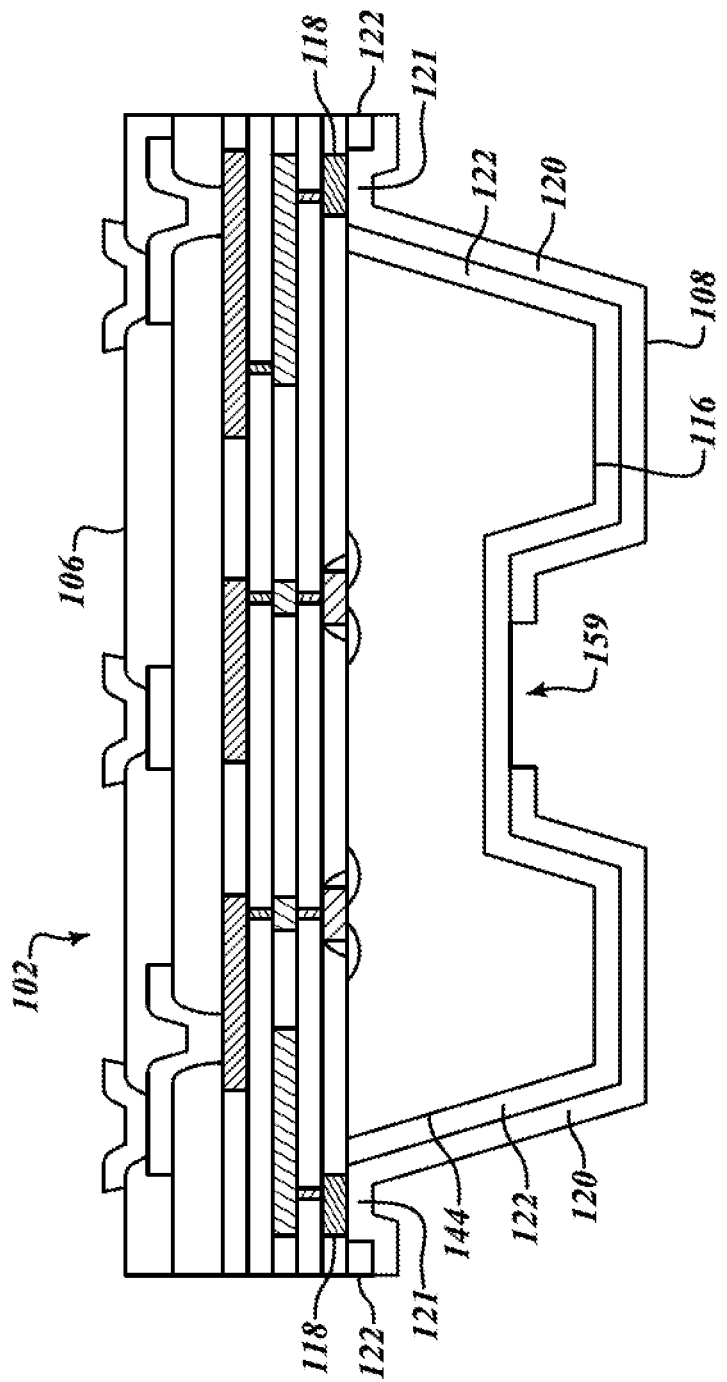
FIG. 6 is a cross-sectional view of the first integrated circuit after a conductive layer has been deposited and patterned, in accordance with the embodiment of FIG. 1.

Referring now to FIG. 6, the redistribution layer 120 is deposited and patterned, forming the second contact pad 121 on the second side 108 and extending past the perimeter of first plurality of first contact pads 118 to the sidewalls 110. The plurality of first contact pads 118 and the redistribution layer 120 are electrically coupled. An opening 159 remains in the recess 126 between ones of the redistribution layers 120. An example of the redistribution layer 120 is Cu with a TiN barrier layer. The use of a Cu interconnect over polyimide dielectric is well known in the art in which Cu is grown using electrolysis on top of TiN barrier having a thin pattern of seed Cu. Other conductive materials may be used for redistribution layer 120 including aluminum (Al).

Figure 7:
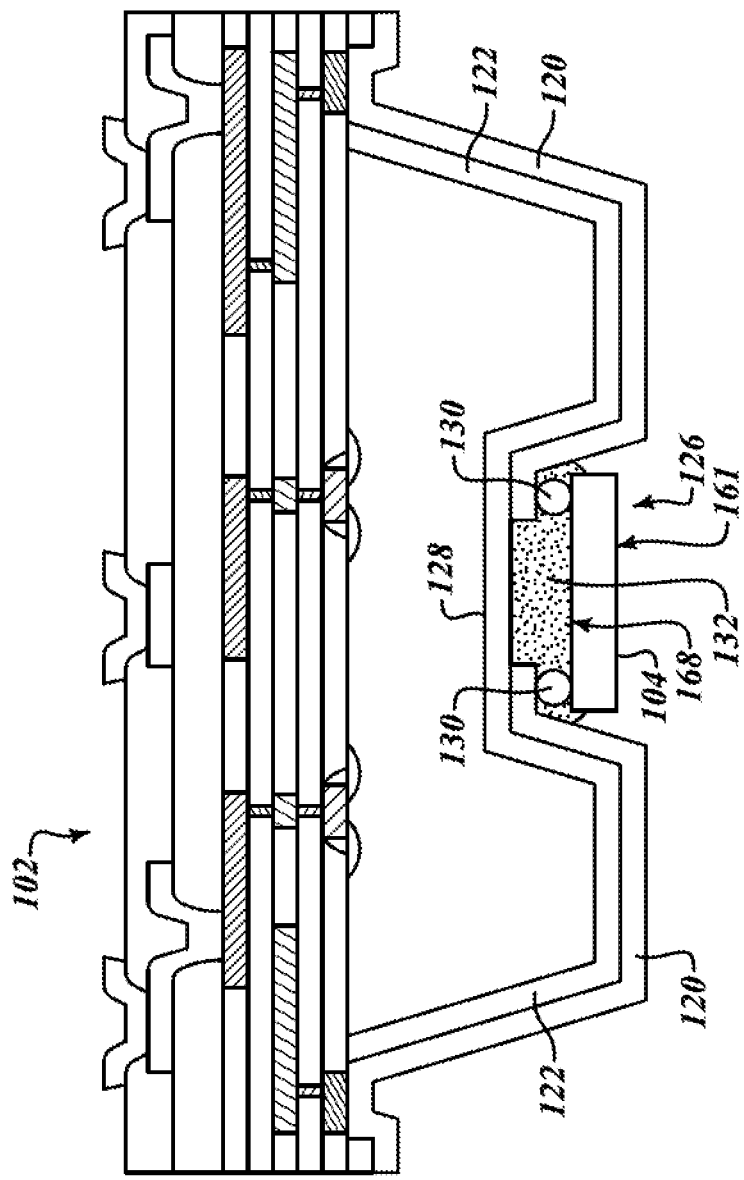
FIG. 7 is a cross-sectional view of the first integrated circuit and the second integrated circuit coupled to the first integrated circuit, in accordance with the embodiment of FIG. 1.

Referring now to FIG. 7, the second integrated circuit 104 includes an active surface 168, such as a ball grid side, and a passive surface 161. The active surface is coupled to active and passive circuitry formed in a substrate of the second integrated circuit, similar to what has been described with respect to the first integrated circuit. The first integrated circuit and the second integrated circuit are designed to work together and share signals through at least the first contact pads 118. The second integrated circuit could be a sensor while the first integrated circuit is a processor or other application specific integrated circuit. The ball grid array 130 is coupled to contact pads (not shown) on the active surface 168 of the second integrated circuit. There may also be a redistribution layer or layers (not shown) that provide coupling structures for the solder balls of the ball grid array 130. The solder balls are coupled either directly or indirectly to the redistribution or traces 120 formed on the substrate.

Underfill 132 is applied at least to a portion of the ball grid side 168 and the second integrated circuit 104 is oriented and placed with the ball grid side 168 facing the recess surface 128. The second integrated circuit 104 is at least partially inside recess 126. Heat is applied coupling the ball grid array 130 both mechanically and electrically to the redistribution layer 120. Underfill 132, previously applied to at least a portion of the ball grid side 168, is constricted and squeezed between the first integrated circuit 102 and the second integrated circuit 104.

Figure 8:
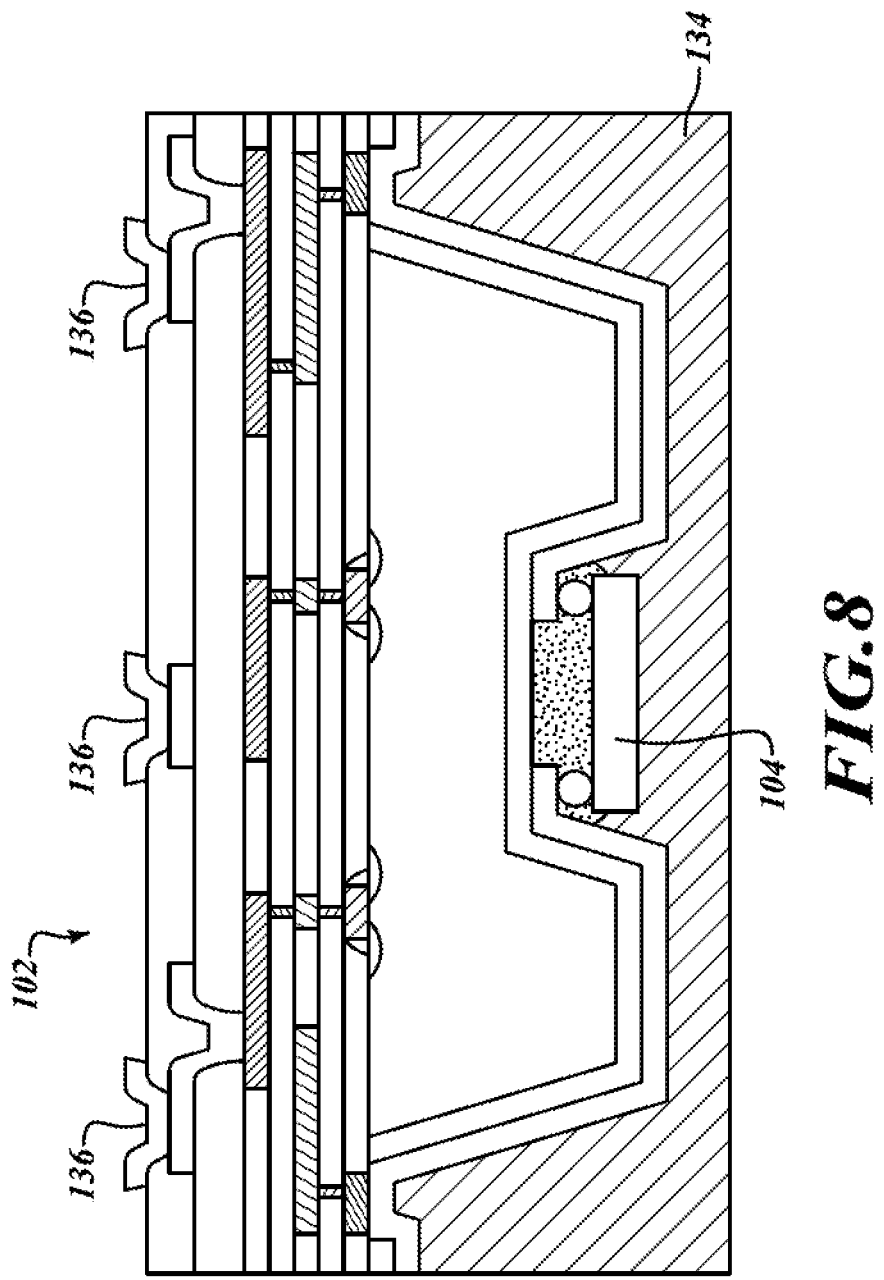
FIG. 8 is a cross-sectional view of a package including the first and second integrated circuit, according to the embodiment of FIG. 1.

Referring now to FIG. 8, a resin is injected on the second side 108 of the first integrated circuit 102 and encasing the second side 108 and the second integrated circuit 104 in molding compound 134. Pad array 136 is externally exposed. Referring now to FIG. 1, solder balls are coupled to the pad array 136. At this point, the wafer is diced.

Figure 9:
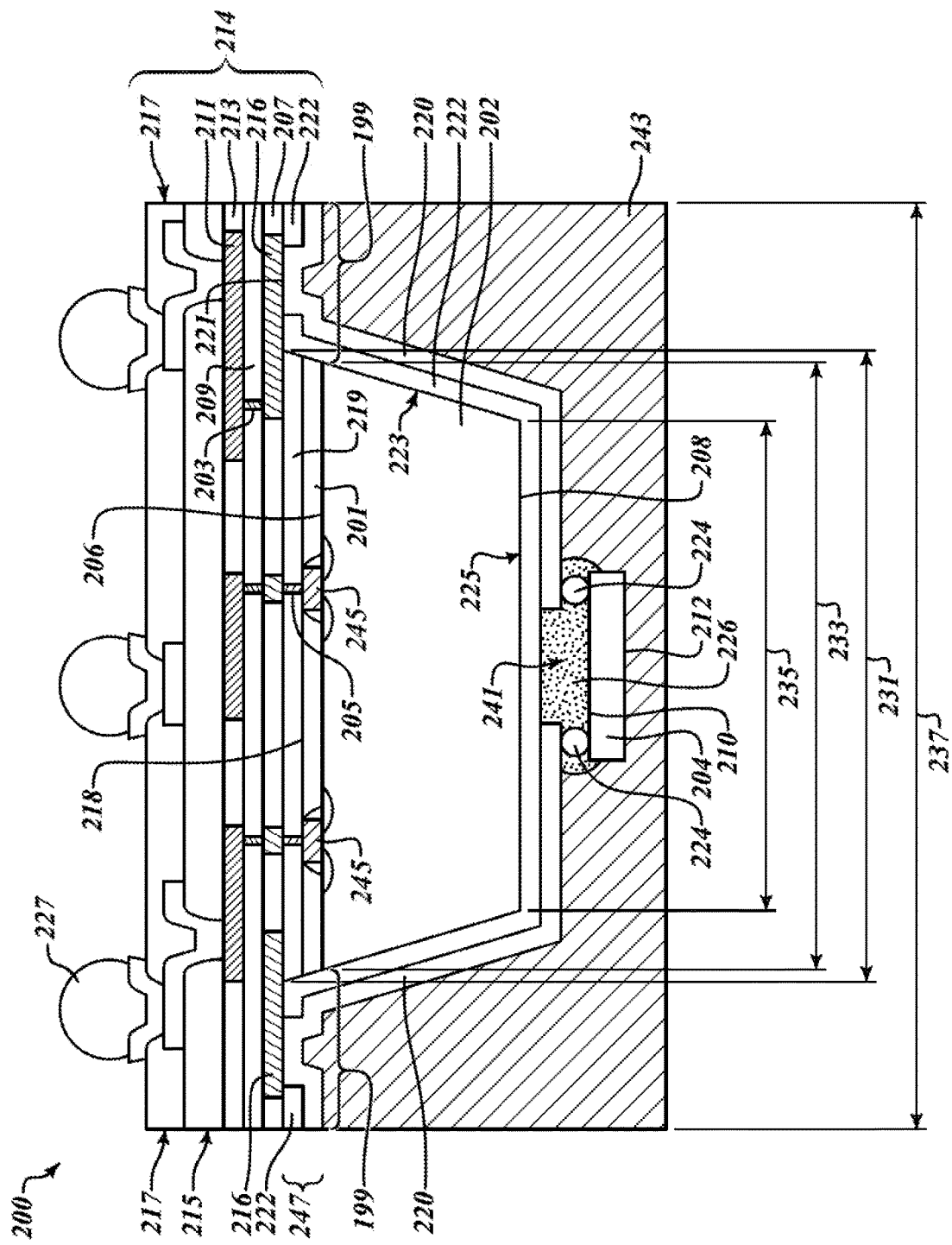
FIG. 9 is a cross-sectional view of an alternative embodiment of a multi-chip package.

Referring now to FIG. 9 another embodiment of a multi-chip package 200 includes a first die 202 and a second die 204. This first die 202 is larger than the second die 204. The first die 202 includes a first surface 206 that is an active surface on which active and passive components can be formed. The active components may include transistors 245 and passive components, such as resistor 218 or capacitors. The components are formed in a substrate, which is part of a wafer. The additional layers, such as a plurality of interconnect layers 214 are formed on the wafer.

The first die 202 has a second side 208, or second surface, that is the remaining surface after the substrate is shaped. The first side 206 may be called the "top side" or the "active device side" since at least a majority of the active devices 245 are on the first side 206. The second die has a first active side 210 and a second passive side 212.

The multi-chip package 200 also includes the plurality of interconnect layers 214 coupled to the first surface 206 of the first die 202. The plurality of interconnect layers 214 includes a first dielectric layer 201 formed on the first surface of the die. A gate of the transistor may be formed on the same level as the first dielectric layer 201. A second dielectric layer 219 is formed on the first dielectric layer 201. A plurality of vias 205 are formed in the second dielectric layer and couple the active and passive components to other layers of the first die.

A first conductive layer 216 is formed on the second dielectric layer 219. A third dielectric layer 207 surrounds the first conductive layer 216. Examples of the first conductive layer 216 include a contact layer, a polysilicon layer, a metal layer, and a redistribution layer. A plurality of vias 203 are formed in a fourth dielectric layer 209. A second conductive layer 211 is formed on the fourth dielectric layer 209. A fifth dielectric layer 213 is on the same level as the second conductive layer 211. A redistribution layer 215 that includes dielectric and conductive layers is formed on the second conductive layer 211. Solder balls 227 are coupled to the redistribution layer 215.

A portion of the substrate of the first die 202 has been removed near a plurality of edges 217 creating an area 199 around the first die 202 at which the first interconnect layer 216 is exposed. Removal of a portion 247 of the plurality of interconnect layers 214 is performed until the first conductive layer 216 is exposed. In this embodiment, the first dielectric layer 201 and the second dielectric layer 219 are removed to form openings at the edges 217. Examples of techniques to selectively remove portions of die 202 and portions of the plurality of interconnect layers 214 include wet chemical etching, dry etching, chemical mechanical removal and mechanical removal, to name a few.

A first contact surface 221 is exposed upon removal of the first and second dielectric layers. The first contact surface 221 may be exposed during a same processing step as removal of excess portions of the substrate, while forming angled sidewalls 223 and surface 225 on the passive side of the first die 202. The first contact surface 221 is a portion of the first conductive layer 216, such that some of the first conductive layer is aligned with the substrate and some of the first conductive layer is not covered by the substrate. In other embodiments, the first conductive layer may be completely in the space uncovered by the substrate.

The substrate starts with a first dimension 237 in a first direction, which corresponds to a distance between edges 217. After removal of portions of the substrate, a largest dimension in the first direction is a second dimension 233. A third dimension 231 extends between remaining edges of the plurality of interconnect layers 214. The first dimension is larger than the second dimension 233. The first dimension is larger than the third dimension 231. The third dimension is larger than the second dimension 233.

The surface 225 has a fourth dimension 235 in the first direction. The fourth dimension is smaller than the second dimension 233. In this embodiment, no recess is formed. As such, the masking patterns and steps will be different than the embodiment described with respect to FIG. 1.

The multi-chip package 200 also includes a plurality of conductive traces 220 that are formed on the angled surface 223 and on the surface 225. An insulator 222 is between the first die 202 and the plurality of conductive traces 220. The plurality of conductive traces 220 are electrically coupled to the first conductive layer 216 near the plurality of edges 217 where the first conductive layer 216 is exposed, through an opening in the insulator over the first conductive surface 221.

As with the second integrated circuit or die discussed above with respect to FIG. 1, the second die 204 includes active and passive components and contact pads on the active surface to which the solder balls 224 are coupled.

The second die 204 is oriented with the first side 210 of the second die 204 facing the second side 208 of the first die 202. In particular, the first active side 210 faces the surface 225. The second die is electrically and mechanically coupled to the plurality of conductive traces 220 on the second side 208 using solder balls 224. There is an opening 241 between adjacent ones of the plurality of conductive traces 220. An underfill 226 is between the first die 202 and the second die 204, in the opening 241. The underfill may extend up sides of the die 204. In other embodiments, the underfill may be omitted.

A molding compound 243 may be formed around the first and second die to form a final package.

In another embodiment, the multi-chip device is similar to that of FIG. 1. The first integrated circuit is a primary integrated circuit and the second integrated circuit is a secondary integrated circuit, smaller in area than the primary integrated circuit. The multi-chip device includes more than one secondary integrated circuits, mounted in one or more recesses on the second side or "back side" of the parent integrated circuit.

In another embodiment, the multi-chip device is similar to that of FIG. 1 omitting the molding compound 134. An example of the utility of this embodiment includes the ability to mount the multi-chip package to a printed circuit board and encapsulate the multi-chip module in resin which bonds with the printed circuit board.

In another embodiment, the multi-chip package is similar to that of FIG. 1, omitting the underfill 132.

An alternate embodiment, the multi-chip package similar to that of FIG. 1 or FIG. 9 includes a second substrate facing away from the second side of the first substrate and electrically coupled to the second conductive layer using bond wires.

In the embodiments of FIGS. 1-8, the substrate 112 has a first thickness from the first surface 114, or active first side, to the second surface 116 or inactive second side. There is a second thickness from the active first surface 114 to the recessed surface 128. The second thickness is less than the first thickness.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure. The same reference number is used for similar or identical features in the various figures.

The invention claimed is:

1. A device, comprising:
   a first integrated circuit, including:
      a first substrate having an active surface, a passive surface, and an edge portion;
      a first conductive layer on the active surface of the first substrate; and
      a second conductive layer on the passive surface of the first substrate, the second conductive layer being coupled to the first conductive layer at the edge portion of the first substrate;
   a second integrated circuit on the passive surface of the first substrate, the second integrated circuit being coupled to the second conductive layer of the first integrated circuit on the passive surface of the first substrate.

2. The device of claim 1 wherein the first integrated circuit includes:
   a first dimension in a first direction that extends from a first sidewall of the first integrated circuit to a second sidewall of the first integrated circuit; and
   a second dimension in the first direction that extends from a first edge of the first substrate to a second edge of the first substrate, the second dimension being less than the first dimension, the edge portion being between the first sidewall and the first edge of the first substrate.

3. The device of claim 1 wherein the first integrated circuit further includes:
   a recess in the passive surface of the first substrate, the second integrated circuit being coupled to the second conductive layer in the recess.

4. The device of claim 1, further comprising:
   an underfill between the first integrated circuit and the second integrated circuit.

5. The device of claim 1 wherein the edge portion includes an opening aligned with a portion of the first conductive layer.

6. The device of claim 1 wherein the first integrated circuit includes a plurality of interconnect layers on the active surface of the first substrate, the plurality of interconnect layers including a plurality of conductive and dielectric layers.

7. The device of claim 6 wherein the first integrated circuit further includes a plurality of contact pads coupled to the plurality of interconnect layers.

8. The device of claim 7, further comprising:
   a molding compound that surrounds the first integrated circuit and the second integrated circuit, and wherein the plurality of contact pads are exposed from the molding compound.

9. A device, comprising:
   a first substrate having a first surface and a second surface;
   a first contact pad on the first surface of the first substrate;
   a second contact pad between the first surface and second surface of the first substrate;
   an opening in the first substrate, the opening exposing a portion of the second contact pad; and
   a first conductive layer on the second surface of the first substrate and coupled to the second contact pad through the opening, the first conductive layer including a third contact pad on the second surface of the first substrate;
   a second substrate on the second surface of the first substrate, the second substrate coupled to the third contact pad of the first conductive layer.

10. The device of claim 9, further comprising:
    a dielectric layer between the first conductive layer and the first substrate.

11. The device of claim 9 wherein:
    the first substrate includes sidewalls transverse to the first surface and the second surface; and
    the second contact pad is closer to at least one of the sidewalls than the third contact pad of the first conductive layer.

12. The device of claim 9, wherein:
    the first substrate includes a recessed surface between the second surface and the first surface; and
    a second integrated circuit is on the recessed surface.

13. The device of claim 9 wherein the second substrate includes a fourth contact pad coupled to the third contact pad of the first conductive layer.

14. A device, comprising:
    a first substrate having a first surface opposite a second surface, the first substrate including a recess surface that is opposite the second surface, the first substrate including:

a first region having a first thickness that is between the first surface and the second surface; and a second region having a second thickness that is between the recess surface and the second surface, the first thickness being greater than the second thickness;

a second substrate on the second surface of the first substrate;

a plurality of first contact pads at a first side of the second substrate laterally adjacent to the second surface of the first substrate; and a plurality of second contact pads between the first surface and the second surface of the first substrate, the plurality of second contact pads on the recess surface, and ones of the plurality of first contact pads being coupled to ones of the plurality of second contact pads; and an integrated circuit is coupled to the plurality of second contact pads and overlaps the recess surface.

15. The device of claim 14, wherein the first substrate further includes a plurality of electrical components at the second surface of the first substrate.

16. The device of claim 15, wherein the second substrate includes a plurality of third contact pads at a second side of the second substrate opposite to the first side of the second substrate, the third contact pads being coupled to the plurality of first contact pads.

17. The device of claim 16, further comprising a plurality of conductive traces that extend along the second region and are coupled between the plurality of first contact pads and the plurality of second contact pads.

18. The device of claim 17, wherein the second substrate includes a plurality of stacked layers including one or more conductive layers and one or more insulating layers, and one or more conductive layers couple the plurality of first contact pads to the plurality of third contact pads.

19. The device of claim 17, further comprising a dielectric layer on the recess surface and on the first surface, the dielectric layer separating the plurality of conductive traces from the first substrate.

* * * * *